United States Patent [19]
Savant

[11] Patent Number: 5,328,383
[45] Date of Patent: Jul. 12, 1994

[54] TOP-LOADED SOCKET FOR INTEGRATED CIRCUIT DEVICE

[75] Inventor: John A. Savant, Austin, Tex.

[73] Assignee: Minnesota Mining and Manufacturing Company, St. Paul, Minn.

[21] Appl. No.: 992,852

[22] Filed: Dec. 16, 1992

[51] Int. Cl.⁵ .......................................... H01R 11/22
[52] U.S. Cl. ..................................... 439/266; 439/331
[58] Field of Search ................ 439/71, 72, 73, 261, 439/263, 266, 330, 331

[56] References Cited

U.S. PATENT DOCUMENTS

| | | | |
|---|---|---|---|
| 4,846,703 | 7/1989 | Matsuoka et al. | 439/266 X |
| 4,846,704 | 7/1989 | Ikeya | 439/72 |
| 4,886,470 | 12/1989 | Billman et al. | 439/266 |
| 4,993,955 | 2/1991 | Savant | 439/73 |
| 5,076,798 | 12/1991 | Uratsuji | 439/269 |
| 5,114,358 | 5/1992 | Myers | 439/266 |

OTHER PUBLICATIONS

Japanese Laid-Open application 4-154065.

Primary Examiner—Larry I. Schwartz
Assistant Examiner—Khiem Nguyen
Attorney, Agent, or Firm—Gary L. Griswold; Walter N. Kirn; John C. Barnes

[57] ABSTRACT

A socket assembly for top-loading IC devices having a cam member, actuated by a vertically moving cover, and having means on the camming surface to produce a sensory act to provide an indication to the operator that the socket contact elements have been moved to an open position as the cover is moved toward the socket body. The sensory act can be audible or feel.

8 Claims, 4 Drawing Sheets

TOP-LOADED SOCKET FOR INTEGRATED CIRCUIT DEVICE

BACKGROUND OF THE INVENTION

1. Field of the Invention

The present invention relates to an improved socket assembly for use with an integrated circuit device or package (IC), having a socket which opens with force applied on the top edges of the socket to allow insertion or removal of the IC, and in one aspect to an improved socket in that means are provided to indicate an opening of the contacts to allow insertion and/or removal of the IC.

2. Description of the Prior Art

Top loading sockets for integrated circuit devices or packages (IC's) are known and are used to connect IC's to printed circuit boards for test or burn-in by automated operations, or for the functional application affording the replacement of the IC without subjecting other components on a printed circuit board or the like to heat, to afford the removal or replacement of the IC. The sockets are designed to load and unload the IC from the top of the socket. This is done manually or by automatic machines, but in any event, the cover on the socket is forced toward the socket body and a plurality of contacts are moved against their biasing force to a retracted position allowing insertion or removal of the IC. It has become important when manual pressure is applied against the cover to know when the open position has been reached to limit the continual application of force to the cover.

Examples of the sockets or carriers of the prior art include applicant's own U.S. Pat. No. 4,993,955 disclosing a carrier for an IC device which has leads and which has a cam member inserted on the socket body to withdraw the contacts, against their inherent biasing force, from a contacting position to a retracted position upon the movement of the cover toward the socket body. There are other patents which show a top load socket having similar top load characteristics but these sockets have the cover engaging each of the plurality of contacts directly to retract the same. These patents include patents such as U.S. Pat. No. 5,076,798 which have a socket body forming a support housing, a plurality of contacts and a contact shutter member comprising a pair of push-down operation portions disposed at both outer sides of the IC receiving window or opening. Guide members are used to maintain the movement of the shutter portions in the vertical direction. This patent also illustrates the use of a pushing portion 21 on the push-down operation portions 18, which has an initial gently inclined surface 21a at a front stage pushing portion and with a steeply inclined surface 21b at a rear stage pushing portion 21b. These portions are formed as linear surfaces and engage the pressure receiving portions 11 of each of the contacts 4. This patent, however, is not considered to provide a teaching of the present invention since the teaching of this patent is to use a gently inclined surface against the contact during the initial retracting stage when the resilient displacement can be obtained by a comparatively small displacement force, and the push-down force is abruptly reduced by using the rear stage steeply inclined surface 21b on the contact 4 to perform the remaining displacement at the latter half stage where the resilient force is increased, thereby achieving a targeted displacement amount and a targeted generally uniform push-down force since the push-down force can be reduced as a whole and a required amount of backward displacement can be obtained with a limited push-down stroke.

The present invention has as its purpose the creation of a change (or step) in the retracting movement of the cover to create an audible sound and/or a sharp change in the force needed to depress the cover and to provide a sensory indication to the operator that, and when, the contacts have reached a retracted open position for reception or removal of the IC.

In the socket of the present invention, the retraction device to retract the contacting portion of the contacts restricts displacement of the contacting portion and assures positive movement of the contacting portion. Further, there is a noted change in the retraction force during the lineal movement of the cover to clearly indicate that the socket is in the open position with the contacting portions of the contacts retracted.

SUMMARY OF THE INVENTION

The socket assembly of the present invention is adapted for use with an integrated circuit device having a plurality of leads arranged along at least one side of the device, and generally four sides. The assembly comprises a socket body having a generally rectangular configuration. The socket body is provided with spacers along at least one side for receiving a plurality of contact elements which are generally planar and are disposed in spaced parallel aligned arrays along the side or sides of the socket body. Each contact element comprises a terminal for connecting the contact element with an external electronic member, an anchor for anchoring the contact element to the socket body, a contacting portion for making resilient pressure contact with a lead or the contact point of an IC (integrated circuit device), and a resilient portion affording the movement of said contacting means from a first normal unflexed position to an open position for receiving an IC and to an operative position in pressure electrical contact with a lead on the IC. A cam member is positioned along the side of said socket body, or along two sides or along each side, and is supported by the socket body for engaging said contact elements to urge the contacting portion thereof from said normal position to the open position. The cam member is operative upon movement of a cover or a top plate supported above the socket body, which cover is mounted for sliding movement in relationship to said socket body from a first position to a second position, affording movement of the cam surface of said cam member for moving the contact elements to an open position upon movement of the cover toward the socket body and to release the contact elements upon movement thereof in a direction away from the socket body. The present invention affords to an operator an indication of when the contacts have been moved to the open position and this is accomplished by the cam follower engaging a cam surface formed with an irregularity in the surface to provide a sensory indication of the position of the cover in relationship to the socket body. The irregularity is a ridge or rib extending transverse to the cam surface at the point where the cam surface makes an abrupt change in contour from a constant initial planar surface at an angle of 50° to the surface of the cover to an abrupt steeper planar surface, the slope of which is at an angle of 85°, to substantially reduce the force required for the continued movement of the cover toward the socket body. A ridge or rib is thus formed at the transition line between the surfaces. A sound may be generated by the cam follower passing over the rib and the force required to continue the movement of the cover is significantly changed so the feel of the cover changes providing an indication to the operator that the contacts are moved to the open position.

BRIEF DESCRIPTION OF THE DRAWINGS

The present invention will be described in detail with reference to the accompanying drawing wherein.

DESCRIPTION OF THE PREFERRED EMBODIMENT

Figure 1:
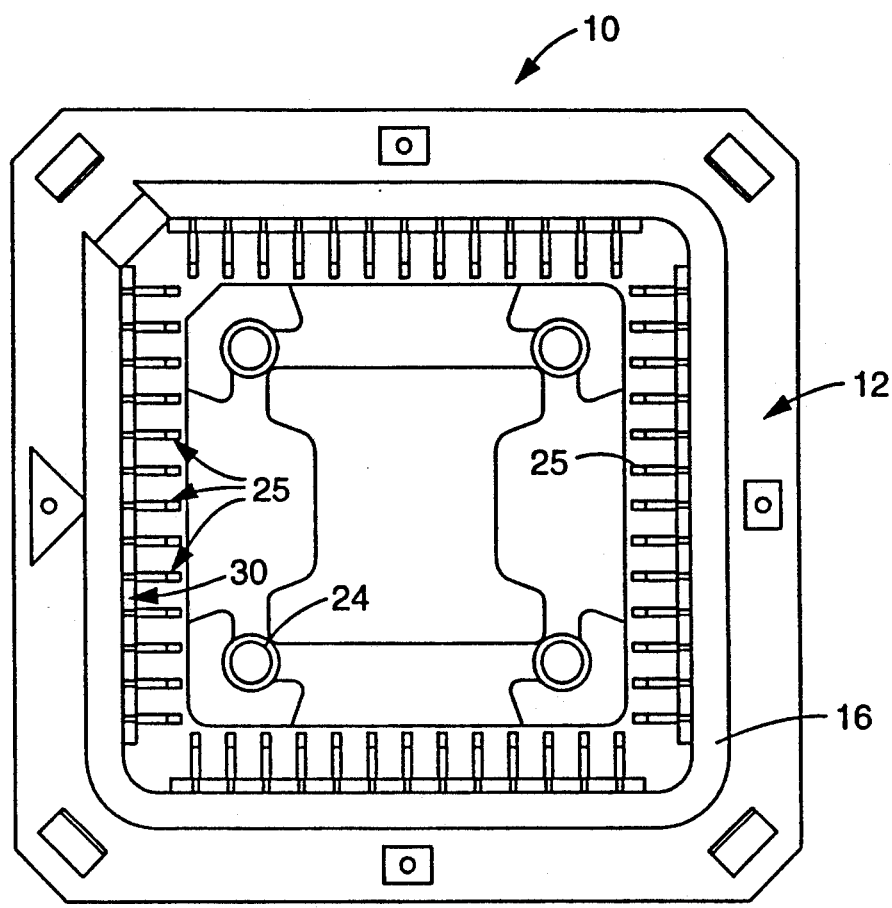
FIG. 1 is a top plan view of the top load socket assembly of the present invention.

The socket assembly of the present invention provides a positive acting cam for moving the contacting portions of the many contacts from a first rest position, to an open IC receiving position, and then to pressure contacting electrical connection with the leads or contact points of an IC placed in the socket assembly. The cam member affords positive engagement with the contacts and restricts displacement of the contacting portions thereof and allows free movement thereof into the contacting position.

Referring now to FIGS. 1 through 4, there is illustrated a socket assembly 10 for use with an IC 11, which assembly is top loading to facilitate automated or manual loading and unloading of the socket to test and burn-in ICs rapidly. The socket assembly 10, illustrated in exploded view in FIGS. 3 comprises a top plate or cover 12 of generally rectangular shape, in this embodiment square, to receive a plastic leaded chip carrier IC package having leads 13 along all four sides in close spaced relationship. The cover has a depending leg 14 at each corner formed with a lower hook member to hold the cover in a predetermined spaced position from a socket body 15. The cover is formed with a central opening or window 16 to receive the IC device. The socket cover 12 is also formed with cam surfaces 17 adjacent each side of the corners and a plurality of closely spaced recesses 18 along each side for receiving the upper free contacting ends of a plurality of contacts 25.

Figure 2:
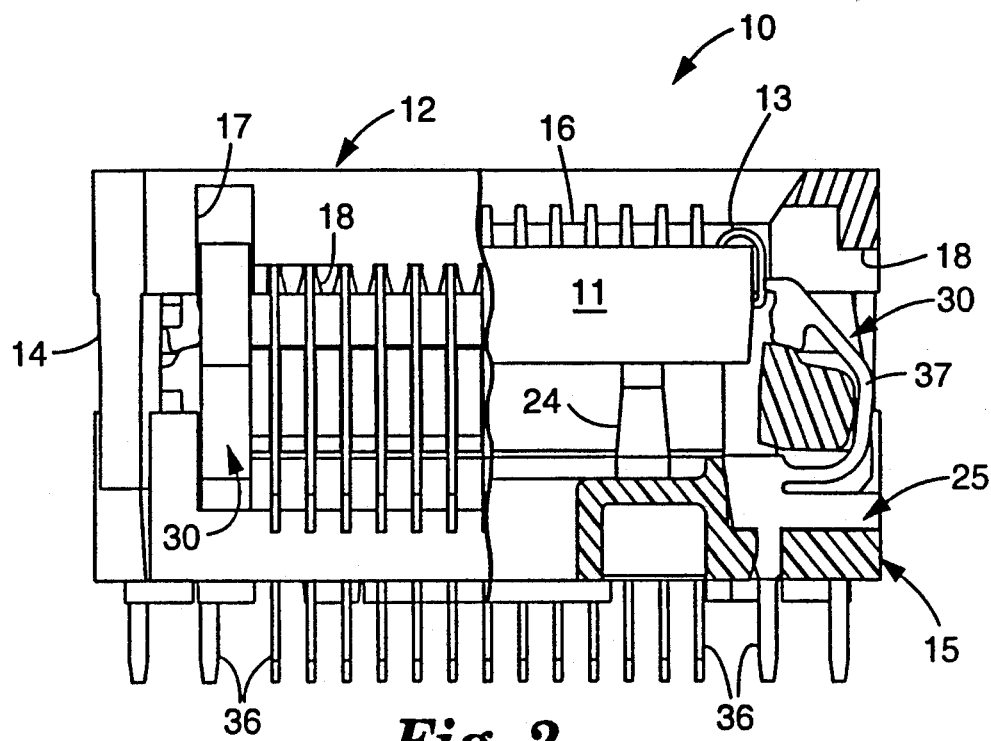
FIG. 2 is a side view, partially broken away for purposes of illustration, of the socket assembly of FIG. 1.
Figure 4:
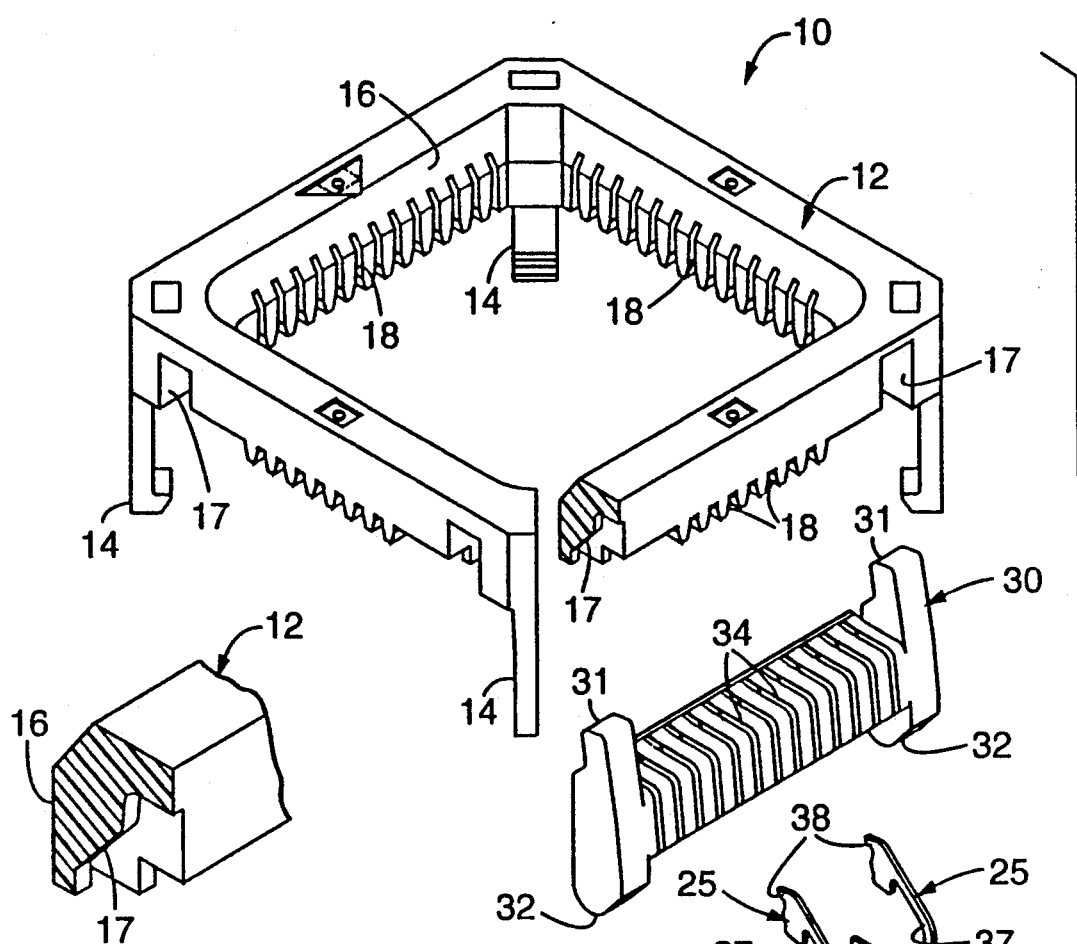
FIG. 4 is an enlarged detail perspective sectional view of the area shown in the circle of FIG. 3.
Figure 3:
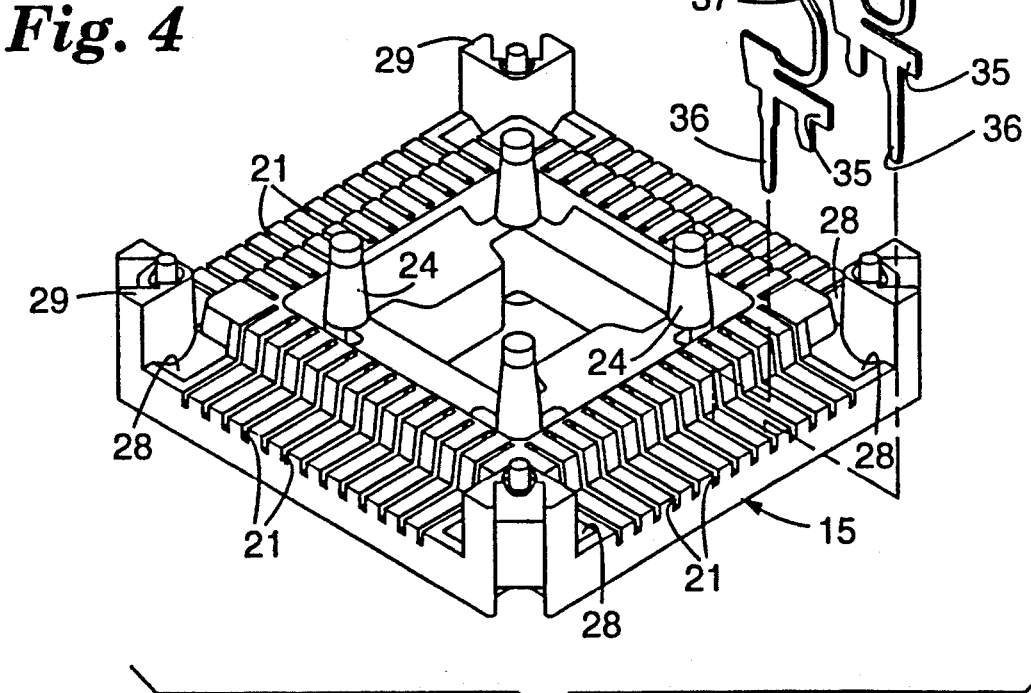
FIG. 3 is a perspective-exploded view of the socket assembly, with the cover partially broken away, only one of four cam members illustrated and only two of the contact elements.

A socket body 15, shown most clearly in FIG. 3, is also generally square in plan view with corners similar to that of the cover 12, except the corners are formed with recesses to receive the legs 14 of the cover 12 which legs 14 latch below the recesses in the corners of the body 15. Along the sides of the socket body 15 are recesses 21 to receive the plurality of contacts 25 and anchor the contacts thereto. The socket body 15 is provided with a central area defining a support for the IC 11, which support is defined by four support posts 24 symmetrically arranged within the center of the socket body and upon which the bottom of the IC will rest as illustrated in FIGS. 2, 5, 6 and 7. The socket body 15 is symmetrical and has four sides. Each side has a recess 28 at the ends adjacent to the corner. These recesses 28 receive and journal or cradle one end of a cam member 30. The recesses 21 space and support the contacts 25, with the anchoring portion 35 positioned in the recess and the pin type lead 36 thereof extending to a position below the socket body for engagement with an opening is a printed circuit board. The contacts 25 have an arcuate resilient portion 37 which is adapted to surround the cam member 30, and the arcuate portion terminates in a contacting portion 38 on the free end for making electrical contact with the lead or post on the IC device to make an electrical connection thereto.

The cam 30, as best illustrated in FIGS. 2 and 3, comprises a bar having opposite ends with a cam follower 31 and a rocker 32 formed at each end. The rocker supports the cam on the socket body 15 in the recesses 28 and the cam followers 31 are positioned to engage the cam surfaces 17 of the cover. Between the ends of the cam 30 and aligned with the recesses 21 and the recesses 28 are slots 34 formed in the outside walls of the cam 30 to receive the arcuate resilient portions 37 of the contacts 37 to maintain the same in spaced positions as the cam forces the contacts from the contact position to an open position which is a position during which stress is placed on the arcuate resilient portions 37 which may cause them to flex. The bar is formed with cam lobes extending radially from the axis of the bar along the upper face at the ends of slots 34, for engaging the contacts 37 adjacent the contacting portion 38. The cam followers 31 at each end of the bar comprise arm means extending radially from the bar to engage the cam surfaces 17 on the cover 12, causing the bar to oscillate to urge the cam lobes against the contacts to force the contacting portions 38 of the contacts 25 from a normally closed position to an open position.

Figure 5:
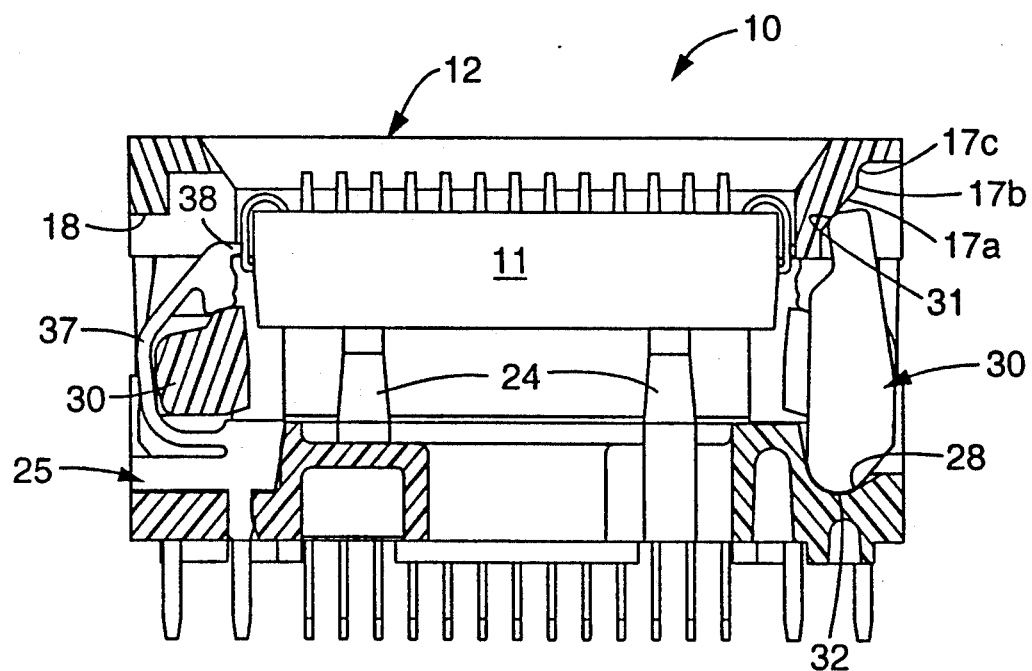
FIG. 5 is a transverse sectional view of the socket assembly of the present invention taken along an irregular section line to show on the left side the position of the contact in the contacting position with the lead of an IC and showing on the right side of the view the position of the cam in relationship to the cover in this same position.
Figure 6:
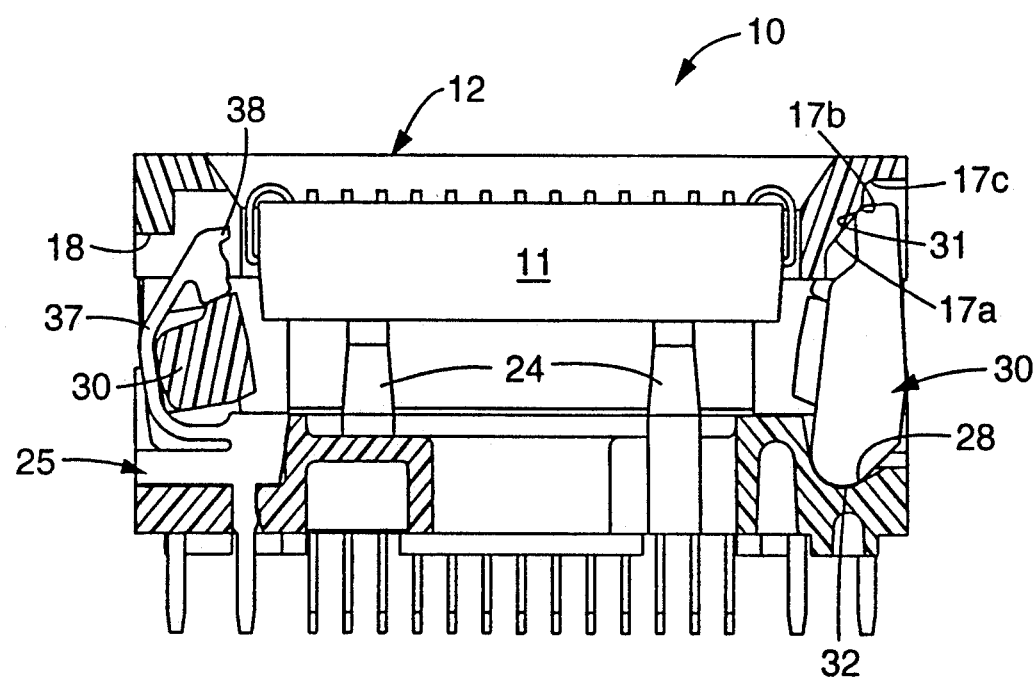
FIG. 6 is a transverse sectional view of the socket assembly of the present invention taken along an irregular section line similar to FIG. 7 to show on the left side the position of the contact in substantially the open position away from the lead of an IC and showing on the right side the position of the cam in the same position.
Figure 7:
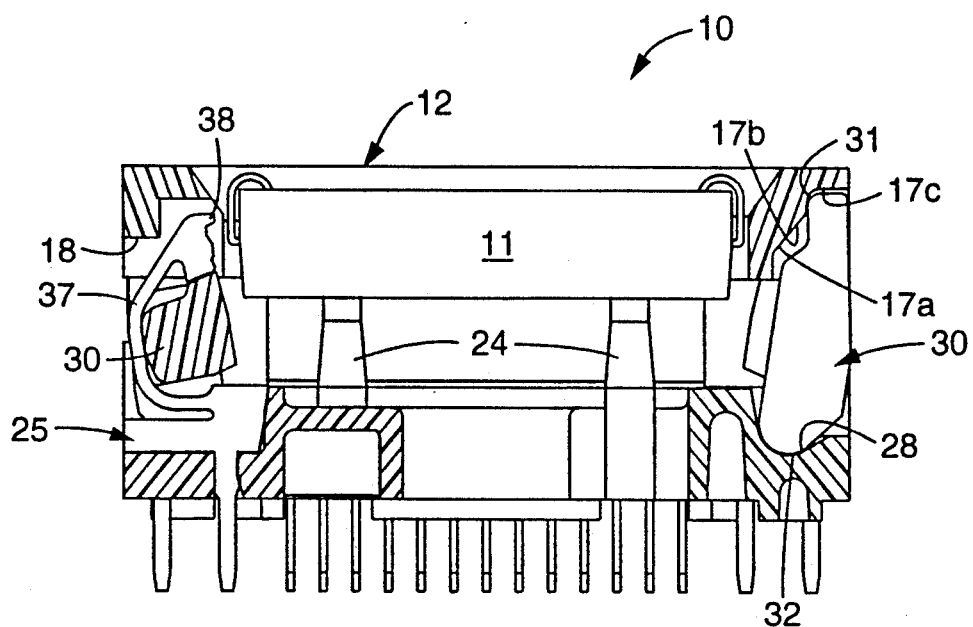
FIG. 7 is a transverse sectional view of the socket assembly of the present invention taken along an irregular section line as in FIGS. 7 and 8 to show on the left side the relationship of the parts with the contact in the retracted position and showing on the right side the position of the cam with the opening force substantially removed.

During assembly of the socket, the contacts are stitched along each side of the socket body 15 into the recesses 21. The cam members 30 are placed along each side of the socket body 15 with the rockers 32 in the recesses 28. The cover 12 is then placed onto the socket body 15 and the legs 14 lock the cover thereon. The vertical movement of the cover 12 toward and away from the socket body 15 causes the cams 30 to rock under the force of the cam followers following a first face 17a of the cam surfaces 17 on the cover 12. As shown in FIG. 5, the contacting portions 38 of the contacts are in forcible electrical contact with the lead of the IC 11. The cam follower of the cam 30 is positioned against the surface 17a. As the cover is moved toward the socket body 15, the cam follower 32 rides along the surface 17a, rotating the cam and causing the upper face to engage the contacts adjacent the contacting portions 38 to drive the same away from the contacting position as shown in FIG. 6. Upon the cam follower 31 reaching a discontinuity or irregularity in the surface 17a of the cam surface as at 17b, the cover moves with substantially less force toward the socket body 15, and the operator, during manual opening of the socket, can feel the change in opening force required and is aware that the contacts have been moved to the open position. This is illustrated in FIG. 7 wherein the cam follower 31 has moved to a position to follow the surface position 17c, until the cover reaches a stop position. The stop position is reached when the upper surfaces of the members 29 at the corners of the socket body 15 engage the lower surfaces of the cover at the corners. Further movement of the cover is restricted.

The contacts 25 are preferably formed from flat conductive sheet stock and typically there are contact elements along each side spaced a distance of 0.5 mm to 0.65 mm. The contact elements 25 are designed to have a contact force against the leads of the IC device of approximately 50 to 70 grams. In a socket with 52 total contacts, positioned 13 to a side of the socket body, the total force needed to retract the contacts approaches 1.85 kilograms. The cam serves to provide considerable mechanical advantage to the force needed to have each contact disengage the IC leads. As the 35 contacting portions 38 of the contacts 25 are retracted, with the cam follower moving along cam surface 17a the force required to move the cover is approximately 1.85 kilograms and as the cam follower passes the rib 17b the force then drops to 1.65 kg during the continued movement. The cam surface 17c is not at 90 degrees to the face of the cover but only sufficiently inclined to allow the force of the contacts to assist in retracting the cover from the position adjacent to the socket body to the initial closed position.

Figure 8:
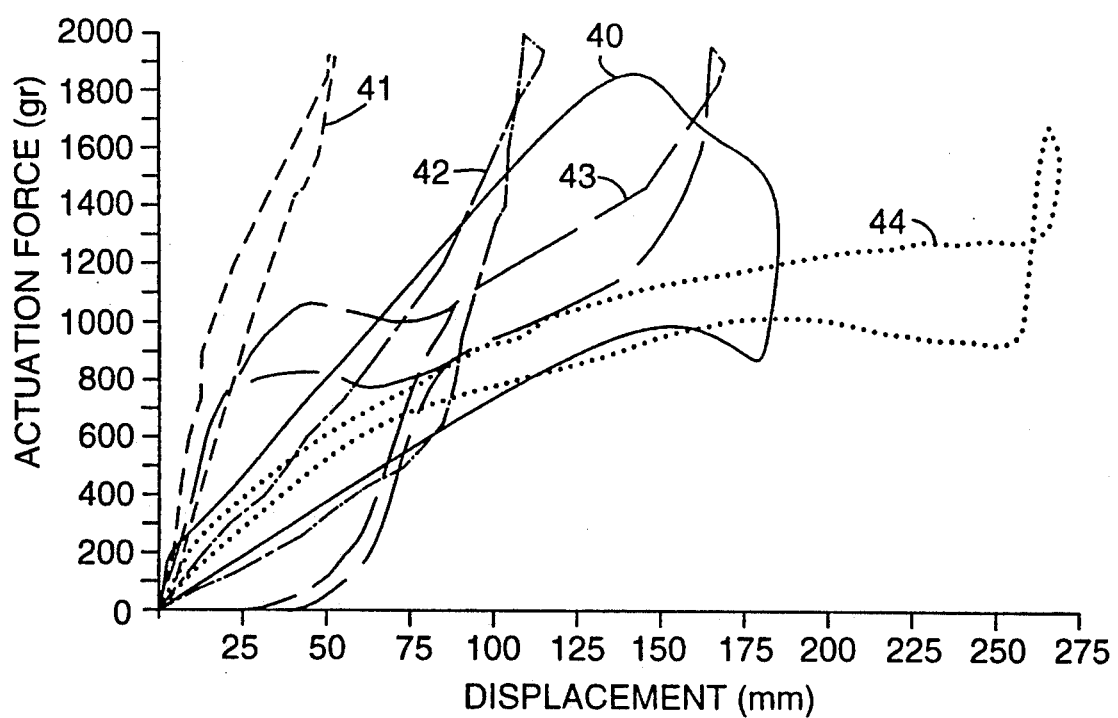
FIG. 8 is a graph illustrating the force curve defined to open the socket assembly of the present invention and to compare this force curve with that of other existing products.

The graph shown in FIG. 8 illustrates a profile of the force F needed to open the socket assembly of the present invention, see solid line 40, plotted against the displacement D of the contacting portion of the contact elements. FIG. 8 also makes a comparison of the forces needed to open the socket assembly of the present invention against the 52 lead PLCC socket of Enplas of Dai-ichi Seiko Co. Ltd of Japan or Enplas-Dai-ichi Seiko of Kawaguchi City of Japan, see the dashed line 41 and legend on the drawing, against the 52 lead PLCC socket of 3M, the assignee of the present application, see the line broken and filled with a dash 42, a 52 lead PLCC socket of Wells Electronics, Inc. of South Bend, Ind. indicated by the broken line 43, and a 52 lead PLCC socket of Texas Instruments Inc. of Dallas, Tex., indicated by the dotted line 44. The graph was generated using a series 1X, Model 1122 Instron Test Instrument. The graph illustrates the opening forces and the closing force against the resistance of the instrument such that for each curve there is an initial positive line and a return line. The graph shows the socket of the present invention has a constant opening force to retract the contacts by 142 mm at which time the cam follower 30 reaches the detent defined by the surface 17b and then the force drops off during the remaining travel of the cam follower and the final opening of the contacts to 188 mm. The Texas Instruments socket requires less opening force and greater displacement of the contact.

Having thus described the present invention, it will be appreciated that changes or modifications can be made in the disclosed and described embodiments without departing from the invention as recited in the appended claims.

I claim:

1. A socket assembly for use with an integrated circuit device having a plurality of contact points arranged along at least one side of the device, said assembly comprising:
   a socket body having a generally rectangular configuration and means along at least one side for receiving a plurality of contact elements,
   a plurality of generally planar contact elements disposed in spaced parallel relationship along said at least one side of said body, each contact element comprising a connecting portion for making connection with an external electronic member, anchor means for anchoring each said contact element to said body, contacting means for making resilient pressure contact with a said integrated circuit device, and a cover movable in relationship to said body for affording the movement of said contacting means from a first normal unflexed position to an open position for receiving a said integrated circuit device an to an operative position in pressure electrical contact with a said integrated circuit device, and
   a cam member, comprising a bar, having cam follower means at each end of the bar, and an upper face to engage the contact elements and provide considerable mechanical advantage for retracting the contacting means, said cam member being positioned along said at least one side of said body and supported by said body for engaging said contact elements and retracting said contact elements to urge said contacting means thereof from a normal position to an open position, and
   said cover having cam surfaces for cooperatively engaging said cam follower means on said cam member for moving said cam member and contact elements to said open position upon movement of said cover toward said body and to release said contact elements upon movement thereof in a direction away from said body, wherein said cam surface s have an irregularity affording an abrupt change in the force necessary to move said cover toward said body, whereby the operator knows when the contact elements have moved to said open position.

2. A socket according to claim 1 wherein said cam follower means comprises arm means for engaging said cam surface of said cover which rock said cam member in a direction to retract said contacting means of said contact elements from said first position.

3. A socket according to claim 2 wherein said cam member comprises a shaft having a longitudinal axis and cam lobes extending radially from said axis and positioned for engagement with said contact elements for urging said contacting means from said normal position to said open position.

4. A socket according to claim 1 wherein said cam member is provided with means for contacting said contact elements to urge the same from said normal position to said open position and with recesses for maintaining separation of said contact elements during engagement with said contact elements.

5. A socket according to claim 1 wherein said cam member is journalled on said body by spaced cradles positioned along said one side of said socket body and said cam follower means includes arm means for engaging said cam surfaces on said cover for affording oscillation of said cam in said cradles to urge said contacting means to open position.

6. A socket according to claim 1 wherein said cam member with said cam follower means affords the movement of said contacting means of said contact elements and each of said contact elements comprises an arcuate portion which extends around said cam member and terminates with said contacting means.

7. A socket according to claim 6 wherein said contact element is formed from flat conductive sheet stock and said arcuate portion is connected to said anchor means and has a cam follower portion for engaging said cam member.

8. A socket according to claim 1 wherein said cam member comprises an oscillatable cam member and a cam member is positioned along each side of said body and a plurality of contact elements are positioned along each side, said cam members affording movement of the contacting means of said plurality of contact elements upon movement of said cover toward and away from said body.

* * * * *